United States Patent [19]

Fahlen et al.

[11] Patent Number: 4,549,091
[45] Date of Patent: Oct. 22, 1985

[54] ELECTRICAL EXCITATION CIRCUIT FOR GAS LASERS

[75] Inventors: Theodore S. Fahlen; Barton Mass, both of San Jose, Calif.

[73] Assignee: Standard Oil Company (Indiana), Chicago, Ill.

[21] Appl. No.: 521,054

[22] Filed: Aug. 8, 1983

[51] Int. Cl.$^4$ .......................... G11C 13/02; H01J 3/10
[52] U.S. Cl. ..................................... 307/106; 307/108; 307/415; 372/25; 372/38
[58] Field of Search ............... 307/106, 107, 108, 414, 307/415, 419, 421; 372/25, 38; 330/4.3

[56] References Cited

U.S. PATENT DOCUMENTS

| | | | |
|---|---|---|---|
| 2,727,160 | 12/1955 | Sanderlin | 307/106 |
| 3,002,113 | 9/1961 | Winn | 307/106 |
| 3,211,915 | 10/1965 | Poehlman et al. | 307/419 |
| 4,272,317 | 6/1981 | Laudenslager et al. | 307/415 |

Primary Examiner—J. R. Scott
Assistant Examiner—Derek S. Jennings
Attorney, Agent, or Firm—William C. Milks, III; William T. McClain; William H. Magidson

[57] ABSTRACT

An electrical excitation circuit is disclosed for a gas laser. The electrical excitation circuit includes a charging circuit connected in series with a pulse forming network between a power source and the laser load. The charging circuit includes a capacitor charged by the power source and a thyratron for transferring voltage to the pulse forming network. Alternatively, the charging circuit includes a capacitor charged upon the firing of a silicon controlled rectifier through a saturable step-up transformer which saturates for transferring voltage to the pulse forming network. The pulse forming network includes a saturable inductor switch positioned with respect to a capacitor so that when the voltage on the capacitor reaches a predetermined level, saturation of the saturable inductor switch releases electrical energy stored in the capacitor to the laser load.

29 Claims, 8 Drawing Figures

PRIOR ART

ELECTRICAL EXCITATION CIRCUIT FOR GAS LASERS

BACKGROUND OF THE INVENTION

This invention relates to electrical pulsing systems. More particularly, the invention relates to pulsed electrical power circuits for high repetition rate gas lasers. Specifically, the invention relates to circuits in which high power, high voltage, fast rise time, narrow electrical pulses provide electrical energy for exciting a gas mixture, thereby producing laser operation.

Electronic transition lasers, such as rare gas excimer, dimer, and charge transfer lasers, offer scalable high energy photon sources in the ultraviolet and visible wavelengths. These lasers can be scaled to high pulsed output energies by increasing the volume, pressure, and energy deposition into a high pressure rare gas halide mixture contained within the laser cavity.

Rare gas halide electronic transition lasers operate on several fundamental principles. First, an intense source of electron excitation is used to excite a mixture of rare gas plus a small percentage of a molecular additive. A selecte rare gas is a dominant component of the mixture because the electron excitation is initially deposited into ionization and excitation of the rare gas. Second, high total pressures are necessary for effective operation of these lasers. Large volume, self-sustained glow discharges, however, are extremely difficult to achieve at high pressures unless special precautions are taken because high pressure glow discharges tend to rapidly form an instability and convert to an arc discharge. Arc discharges constrict into small streamers, thereby eliminating the volume excitation necessary for proper laser operation. Accordingly, an efficient high pressure electric discharge for rare gas halide electronic transition lasers is characterized by a discharge that is volumetric and stable (i.e., does not degenerate into a constricted arc). Third, the electron energy in the discharge should be high enough to produce sufficient rare gas ions and metastables. There should also be a sufficiently high current density in order to produce a sufficient number of excited rare gas species in a short time period which is less than the time required to react all of the molecular additive. These three criteria require a high power, high voltage discharge circuit incorporating some method for stabilizing the discharge to prevent arcing.

Many problems have been encountered in the implementation of discharge circuits necessary to produce the high electron temperatures required in high pressure rare gas buffered mixtures. Typical problems are that the gas tends to break down at too low a voltage. Also, discharges at electron energies necessary for efficient pumping of the laser tend to constrict into an arc unless the discharge pulse has a very steep rate of rise (under 100 nanoseconds) and the duration is kept shorter than the arc formation time or the time to react all the molecular additive. The gas after breakdown has a very low impedance (i.e., less than several ohms) which necessitates a low impedance discharge circuit for efficient energy deposition into the laser load. High voltage charging circuits typically have too large an inductance to provide either a rapid voltage rise time or a sufficiently low output impedance for optimum energy transfer to the laser load. Consequently, a key problem associated with these lasers is the development of an efficient, long-lived, nondestructive, nonablative reliable and inexpensive method of electron energy deposition into the laser load. The pulse rise time shaping, pulse width compression, and impedance matching electrical excitation circuit of the present invention provides an effective solution to the problem.

U.S. Pat. No. 4,275,317 discloses a circuit for the purpose of efficient energy transfer from a relatively slow high power, high voltage charging circuit to a laser load. The circuit comprises one or more saturable inductor switches, each of which has an associated distributed capacitance energy storage device. Energy is provided to a distributed capacitance energy storage device by a voltage source and is contained therein by a saturable inductor switch. When the energy build-up reaches a predetermined level, the saturable inductor switch becomes saturated, thereby allowing the energy to flow therethrough and into either a next intermediate capacitance energy storage device or the laser load.

The basic operation of the circuit disclosed in U.S. Pat. No. 4,275,317 is that of a Melville line. W. S. Melville, *Proceedings of The Institute of Electrical Engineers*, Vol. 98, Part III, Number 53, pp. 185–207, May, 1951. With the aid of FIG. 1, a capacitor $C_1$ is charged rather slowly by an external charging circuit with a saturable inductor $L_1$ saturating at the peak voltage on the capacitor $C_1$. When the saturable inductor $L_1$ saturates and switches to a low inductance, a capacitor $C_2$ is charged more rapidly to near the same voltage. A saturable inductor $L_2$ saturates at the peak voltage on the capacitor $C_2$, charging a small capacitor $C_3$ in an even shorter time and providing a discharge current for the laser load through an inductor $L_D$.

Since the unsaturated inductance is not infinite, some prepulse voltage appears across the laser load of the circuit disclosed in U.S. Pat. No. 4,275,317. The purpose of the capacitor $C_3$ is to reduce the magnitude of prepulse to prevent laser breakdown. The prepulse amplitude and voltage rise time are both inversely proportional to the value of the capacitor $C_3$. Thus, a tradeoff between prepulse and rise time occurs. Since the current does not reverse between charging and discharging, a magnetic diode across the laser as used in the present invention would not be practical with the circuit disclosed in U.S. Pat. No. 4,275,317. The electrical excitation circuit in accordance with the present invention reduces the amplitude of the prepulse across the laser load without an increase in rise time.

When the laser discharge begins, a large fraction of the discharge current flows from the capacitor $C_2$ through the saturable inductor $L_2$ of the circuit disclosed in U.S. Pat. No. 4,275,317. The effective laser discharge inductance is therefore $L_D + L_2$ (saturated). The total inductance in the discharge loop must be minimized for optimum laser performance. The inductance of the saturable inductor $L_2$ (saturated) will be somewhat above the air core value and can be as low as a few nanohenries with careful construction. The discharge loop inductance (neglecting the inductance of the saturable inductor $L_2$) is typically a few nanohenries, and, therefore, the saturable inductor $L_2$ represents a significant increase in total loop inductance. In accordance with the present invention, an electrical excitation circuit is provided which avoids any added inductance in the discharge loop.

U.S. Pat. No. 4,275,317 discloses that distributed capacitance energy storage devices must be utilized in order to provide the high voltage, narrow pulses required by electronic transition lasers. Distributed capacitance energy storage devices which can be used include coaxial lines, multiple coaxial lines, parallel plate transmission lines, or two or more parallel-connected capacitors having an associated natural or added inductance for creating a pulse shaping network.

U.S. Pat. No. 4,275,317 further discloses that in order to achieve efficient operation of the laser, a pulse shaping network providing less than 10-nanosecond rise time pulses with durations in the hundred nanoseconds region must be used, and, therefore, the saturable inductor switch must have characteristics, and be constructed, in a manner differing from that of conventional saturable inductor switches. That is, the saturable inductor switch must be formed of a material having a very high permeability and a cross-sectional thickness on the order of the skin depth of the material at a frequency corresponding to the desired rise time of the pulse. For many types of lasers a high voltage 10-nanosecond rise time pulse is desirable, and, therefore, the skin depth criterion requires that the material thickness be on the order of one to two microns. Magnetic material films of this thickness can be obtained by deposition on a plastic insulator backing. These backings can be formed into a tape which is then wound around a suitable nonmagnetic core material, thereby creating the saturable inductor switch.

The circuit disclosed in U.S. Pat. No. 4,275,317 requires distributed capacitance energy storage devices and saturable inductor switches which must be tailored for a specific laser configuration, and are both difficult to fabricate, and expensive. In accordance with the present invention, an electrical excitation circuit is provided which is adjustable for different laser configurations, is largely fabricated with readily available commercial components, and is relatively inexpensive.

SUMMARY OF THE INVENTION

The invention provides an electrical excitation circuit including a pulse forming network for generating pulses of a given energy level. This network, when charged, is capable of discharging the charge energy within a preselected pulse width interval. Charging of the network is done over a charging period in excess of the pulse width sought and with a charging current lower than the pulse discharge current. The slow-charge energy is rapidly discharged to obtain the high-energy pulse desired by means of a switching device in the pulse forming network in the form of a saturable inductor switch which is not connected to the discharge loop with the laser load.

The invention provides an electrical excitation circuit which can efficiently produce a high voltage pulse of very short rise time and duration for a laser load. The electrical excitation circuit in accordance with the invention includes a charging circuit means connected in series with a pulse forming network between a power source and the laser load. The pulse forming network includes at least one capacitor, preferably a discrete ceramic capacitor, connected to the laser load. A saturable inductor switch is connected to the at least one capacitor so that as the capacitor is charged, only a small amount of the energy is absorbed by the saturable switch until the switch becomes saturated. At that time, the inductance of the saturable inductor switch decreases, and the energy contained within the at least one capacitor is switched into the laser load.

In accordance with the invention, an electrical excitation circuit for a gas laser is provided connected between a power source and a laser load comprising: charging circuit means connected to the power source; and a pulse forming network connected to the charging circuit means and the laser load, the pulse forming network comprising (a) a saturable inductor switch alternatively having an unsaturated state and a saturated state, the saturable inductor switch being shunted across the charging circuit means and (b) at least one capacitor shunted across the saturable inductor switch and connected to the laser load, the at least one capacitor being charged by the charging circuit means when the saturable inductor switch is in the unsaturated state and being discharged through the laser load when the saturable inductor switch transposes to the saturated state. The operating point of the saturable inductor switch is preferably controlled by a bias circuit, thereby allowing adjustment of the operating point for a given laser load, as well as enabling the saturable inductor switch to be constructed from readily available components. The saturable inductor switch is not in the discharge loop of the laser load. This enables the electrical excitation circuit to meet the principal requirements for use with gas lasers, low inductance and ability to switch high voltage and high currents.

Preferably, the pulse forming network further comprises a second capacitor connected between the at least one capacitor and the laser load and a magnetic diode charging inductor shunted across the laser load, the second capacitor being charged by the charging circuit means through the magnetic diode charging inductor when the saturable inductor switch is in the unsaturated state and being discharged through the laser load in series with the at least one capacitor when the saturable inductor switch transposes to the saturated state. This effectively provides voltage doubling of the discharge voltage across the laser load. This capability allows a lower voltage in the relatively slow charging circuit means, which simplifies the configuration and reduces stress on the components. The magnetic diode charging inductor provides a charging path for the second capacitor and at the same time prevents prepulse (breakdown) of the laser gas. The operating point of the magnetic diode charging inductor is preferably controlled by a bias circuit, thereby allowing adjustment of the operating point for a given laser load, as well as enabling the magnetic diode charging inductor to be constructed from readily available components. As in the basic electrical excitation circuit configuration, however, the saturable inductor switch is not in the discharge loop; and, also, the magnetic diode charging inductor is likewise not in the discharge loop.

In one embodiment of the electrical excitation circuit of the invention, the charging circuit means included in the electrical excitation circuit can comprise a power source capacitor shunted across the power source and connected by a series-connected choke and charging diode to a parallel circuit comprising, as one branch, a triggerable thyratron and, as the other branch, a charging capacitor and an inductor, the charging capacitor and inductor being in series with the saturable inductor switch included in the pulse forming network of the electrical excitation circuit. The at least one capacitor included in the pulse forming network is charged when the thyratron is triggered.

In another embodiment of the electrical excitation circuit of the invention, the charging circuit means included in the electrical excitation circuit can comprise a series-connected choke, primary winding of a saturable step-up transformer, and power source capacitor in a parallel circuit with a triggerable silicon controlled rectifier connected across the power source. The operating point of the saturable step-up transformer is preferably controlled by a bias circuit, thereby allowing adjustment of the operating point for a given laser load, as well as enabling the saturable step-up transformer to be constructed from readily available components. A charging capacitor and a charging diode are connected in series across the secondary winding of the step-up transformer, and at least one saturable inductor switch circuit comprising a capacitor and a saturable inductor switch is connected between the charging capacitor and the pulse forming network, the at least one saturable inductor switch circuit being shunted across the saturable inductor switch included in the pulse forming network of the electrical excitation circuit. The operating point of each saturable inductor switch circuit is preferably controlled by an associated bias circuit, thereby allowing adjustment of the operating point for a given laser load, as well as enabling each saturable inductor switch circuit to be constructed from readily available components. A plurality of saturable inductor switch circuits can be cascaded between the charging capacitor and the pulse forming network, each additional saturable inductor switch circuit providing a further degree of pulse compression and shaping.

A pre-ionization means is preferably included in the electrical excitation circuit in accordance with the invention for conditioning the laser gas mixture so that a uniform discharge occurs across the electrodes of the laser. Preferably, the pre-ionization means is an x-ray circuit. Alternatively, a corona pre-ionization circuit can be included.

Both efficiency and lifetime of a gas laser are improved by the electrical excitation circuit of the invention in the laser's electrical discharge system. The electrical excitation circuit improves the laser's efficiency by speeding the deposition of electrical energy into the laser gas. Incorporation of the electrical excitation circuit between the power source and a gas laser reduces the voltage rise time from hundreds of nanoseconds, for example, 200 nanoseconds, to tens of nanoseconds, for example, 30 nanoseconds. This short rise time is required to produce a uniform (i.e., arcless) discharge in the gas, and such a discharge is required to convert a large portion of the electrical input to optical output.

BRIEF DESCRIPTION OF THE DRAWINGS

The above and other features of the invention and the concomitant advantages will be better understood and appreciated by those skilled in the art in view of the description of the preferred embodiments given below in conjunction with the accompanying drawings. In the drawings.

DESCRIPTION OF THE PREFERRED EMBODIMENTS

Figure 1:
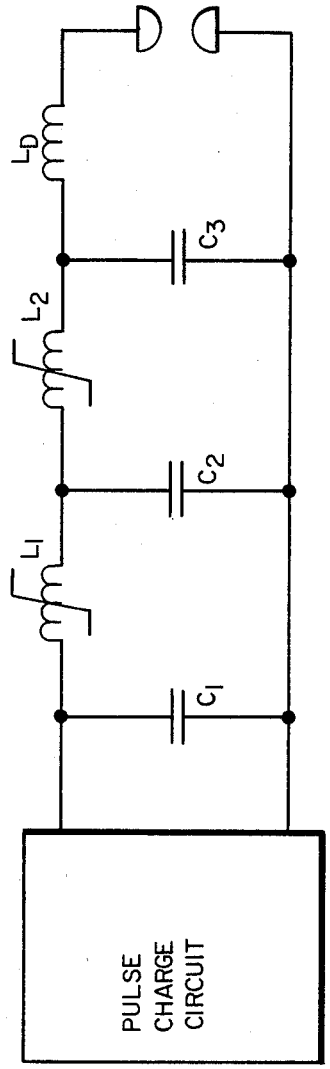
FIG. 1 is a schematic diagram of a known pulse shaping network connected to a charging circuit for exciting a laser load useful in understanding the features and advantages of the electrical excitation circuit in accordance with the invention.
Figure 2:
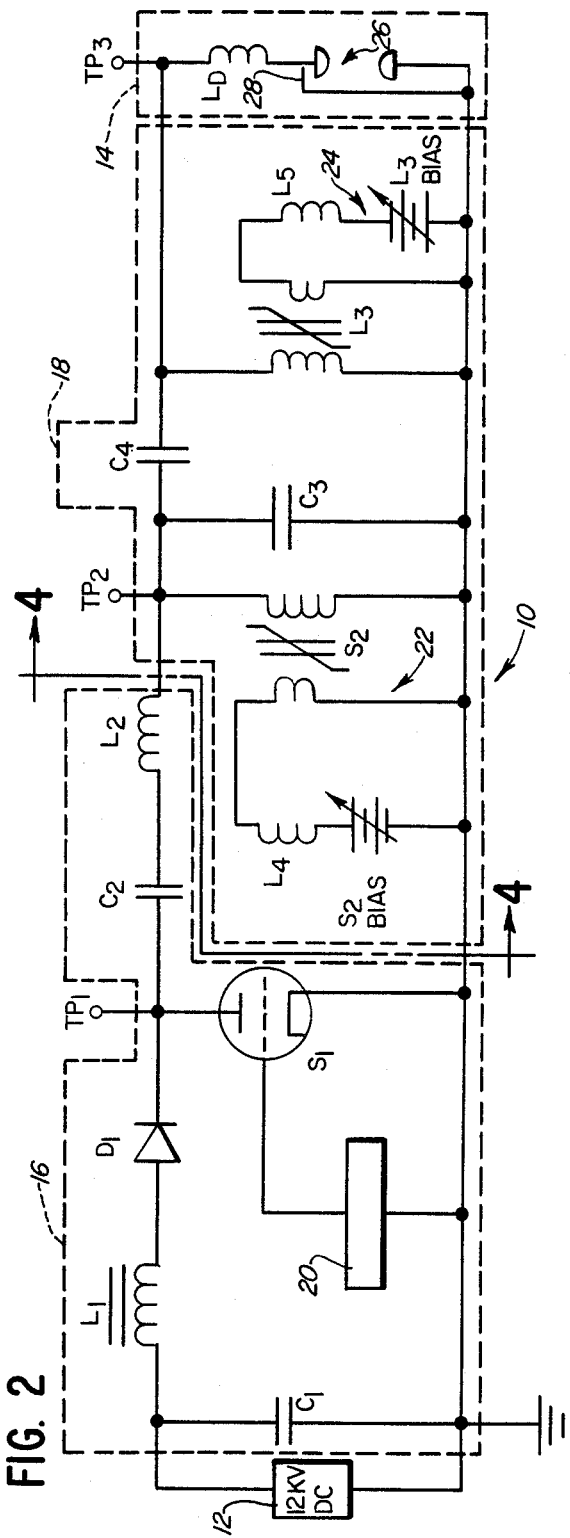
FIG. 2 is a schematic diagram of one embodiment of an electrical excitation circuit in accordance with the invention for connecting an electrical power source to a laser load.

The invention provides a gas laser electrical excitation circuit, that is, a pulse discharge circuit used to generate a high power, high voltage, high pulse rate, gas laser discharge. FIG. 2 is a simplified schematic diagram of one embodiment of the electrical excitation circuit in accordance with the invention, generally indicated by the numeral 10.

Referring now to FIG. 2, the electrical excitation circuit 10 provides an electrical interface between a high voltage, high impedance power source 12 and a relatively low impedance laser load 14. The electrical excitation circuit 10 includes a charging circuit 16, which charges a pulse forming network 18. The pulse forming network 18 rapidly releases stored energy to the laser load 14.

The power source 12 is preferably a direct current power source. The power source 12, for example, can be a 12 kV direct current rectified power supply.

The charging circuit 16 included in the electrical excitation circuit 10 shown in FIG. 2 includes a power source capacitor $C_1$ shunted across the power source 12. The charging circuit 16 also includes a charging transformer or choke $L_1$ and an isolating or charging diode $D_1$ connected in series between the power source 12 and a first terminal or node $TP_1$. The choke $L_1$ and charging diode $D_1$ isolate the power source 12 from the pulse forming network 18. A thyratron $S_1$ is included in the charging circuit 16 connected between the first node $TP_1$ and ground or common, the control electrode of the thyratron being connected to a source of an input trigger signal generated by a pulse generator circuit 20. Finally, the charging circuit 16 includes a charging capacitor $C_2$ series-connected with an inductor $L_2$ between the first node $TP_1$ and a second terminal or node $TP_2$. The capacitor $C_1$ is significantly larger than the capacitor $C_2$.

The pulse forming network 18 included in the electrical excitation circuit 10 shown in FIG. 2 includes a saturable inductor switch $S_2$ connected between the second node $TP_2$ and common. A biasing circuit 22 for the saturable inductor switch $S_2$ is included in the pulse forming network 18 and comprises a $S_2$ bias power source and a choke $L_4$ connected in series with the bias winding of the saturable inductor switch. The $S_2$ bias power source is an adjustable direct current power supply connected so that bias current flows through the bias winding of the saturable inductor switch $S_2$ in the direction from top to bottom in FIG. 2. The choke $L_4$ provides isolation of the $S_2$ bias power source from high voltage pulses produced by transformer action on the bias winding of the saturable inductor switch $S_2$. The pulse forming network 18 also includes a first pulse forming network capacitor $C_3$ shunted across the saturable inductor switch $S_2$. A second pulse forming network capacitor $C_4$ is included in the pulse forming network 18 connected between the second node $TP_2$ and a third terminal or node $TP_3$. Additionally, the pulse forming network 18 includes a magnetic diode charging inductor $L_3$ connected between the third node $TP_3$ and common. Finally, the pulse forming network 18 includes a biasing circuit 24 for the magnetic diode charging inductor $L_3$, which comprises a $L_3$ bias power source and a choke $L_5$ connected in series with the bias winding of the magnetic diode charging inductor. The $L_3$ bias power source is an adjustable direct current power supply connected so that bias current flows through the bias winding of the magnetic diode charging inductor $L_3$ in the direction from bottom to top in FIG. 2. The choke $L_5$ provides isolation of the $L_3$ bias power source from high voltage pulses produced by transformer action on the bias winding of the magnetic diode charging inductor $L_3$.

As shown in FIG. 2, the laser load 14 is connected between the third node $TP_3$ and common. The inductance $L_D$ represents the distributed inductance of the electrode structure 26 of the laser load 14. A pre-ionization circuit 28 is preferably included in the laser for conditioning the gas mixture so that there is a uniform discharge and not arc discharges which constrict to streamers when the energy stored in the pulse forming network 18 is released and deposited into the gas mixture between the electrodes 26.

The electrical excitation circuit 10 performs four relatively separate operations: a slow resonant charge of the charging capacitor $C_2$, a medium speed charge of the pulse forming network 18, an inversion of the voltage on half of the pulse forming network, and finally the laser discharge. These operations will be described in sequence later. The description first treats saturable magnetic elements, such as the saturable inductor switch $S_2$ and the magnetic diode charging inductor $L_3$, which are either in a high inductance (unsaturated) condition or a low inductance (saturated) condition as determined by current flow and bias. The functioning of these saturable magnetic elements is described in some detail in order to facilitate an understanding of the operation of the electrical excitation circuit 10.

Generally, when a small amount of current is fed into a saturable inductor, its magnetic permeability, and hence its impedance, is high. At a certain current level, however, it saturates; and the permeability and impedance drop off rapidly, producing a switching effect so that in the case of a laser, for example, stored energy is deposited into the laser gas.

Figure 3:
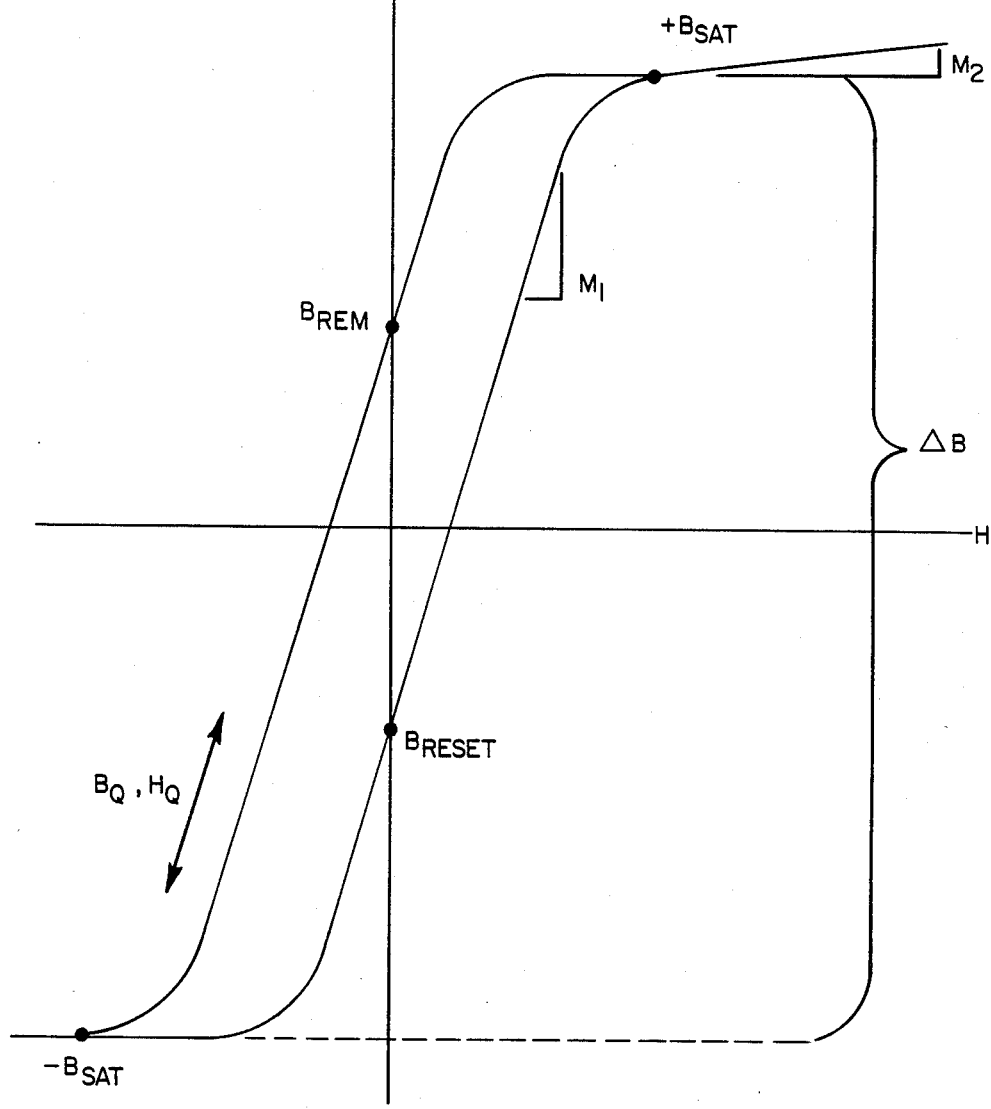
FIG. 3 illustrates a B-H curve for the purpose of facilitating an understanding of the operation of the saturable magnetic elements included in the circuit of FIG. 2.

A typical B-H curve for ferromagnetic material is shown in FIG. 3. Several points are plotted on the curve and will be discussed. First, a brief description of inductance will be presented.

The inductance of an inductor having a ferromagnetic core (rather than an air core) is proportional to the slope of the B-H curve at the operating point ($L \propto \Delta B / \Delta H$). When operating in the linear region (i.e., slope $= M_1$), this inductance is considerably greater than the air core value. If the magnetization is increased to the saturation point ($\pm B_{SAT}$), the slope of the B-H curve changes to a lower value ($M_2$) with a corresponding drop in inductance. The magnitude of these slopes ($M_1$ and $M_2$) and the corresponding inductances depend upon a number of factors, including the type of magnetic material and the operating frequency. Generally, the saturated inductance is between one to two times the air core value for a properly constructed saturable inductor.

Operation of a saturable inductor as a switch requires that the switching action occur at a specific time after application of voltage. The time required to saturate the core can be found from the relationship $$T = NA\Delta B/E$$

where N is the number of conductor turns about the core, A is the cross-sectional area of the core, E is the integrated applied voltage, and $\Delta B$ is the available change in magnetization. For maximum flexibility, it is desirable to be able to vary the applied voltage E without changing the switching time T. Since the number of turns N and the area A are fixed for a given core, it is necessary to adjust $\Delta B$.

The value of $\Delta B$ for a given material is determined by the quiescent operating point. Without bias, this value will be $B_{REM}$ (or $B_{RESET}$ if the core is reset).

It is possible to vary the operating point of the core to an arbitrary quiescent point ($B_Q$, $H_Q$) by providing a bias current in the saturable inductor. The magnitude of the bias current can be found from $$I = 1\Delta H/N$$

where 1 is the length of the magnetic path, N is the number of turns in the bias winding, and $\Delta H$ is the required change in magnetic field intensity to establish the quiescent operating point. A variable current supply can be used to set the operating point anywhere between $\pm B_{SAT}$. This permits the value of $\Delta B$ to be adjusted to account for different applied voltages, as well as to allow for tolerances in materials.

Operation of a saturable inductor as a magnetic diode requires setting the bias point to saturation. Any current in one direction will drive the saturable inductor further into saturation, resulting in a low inductance value, while a current reversal will force the saturable inductor into the linear region with a resulting high inductance value.

The initial phase of operation of the electrical excitation circuit 10 shown in FIG. 2 is a slow resonant charge of the charging capacitor $C_2$ included in the charging circuit 16. The laser discharge sequencing starts when the 12 kV DC appearing on the capacitor $C_1$ from the power source 12 is doubled in a resonant charging circuit comprising the capacitor $C_1$, the choke $L_1$, the isolating diode $D_1$, the capacitor $C_2$, the inductor $L_2$, and the saturable inductor switch $S_2$. During the 1.2 msec required for the voltage on the capacitor $C_2$ to reach 24 KV, the voltage at the second node $TP_2$ is clamped to near zero by the low impedance of the saturable inductor switch $S_2$ which is biased into a low inductance (saturated) condition by current flowing from the $S_2$ bias power source through the choke $L_4$ and the bias winding of the saturable inductor switch in the direction from top to bottom in FIG. 2. The sinusoidal charging current of 1.9 amperes peak also flows through the saturable inductor switch $S_2$ from top to bottom. (All currents used are Franklin current not electron current, i.e., current flows from plus to minus.) This is in the same direction as the bias current through the saturable inductor switch $S_2$ and has negligible effect on the quiescent magnetic bias point of the saturable inductor switch. When the voltage at the first node $TP_1$ reaches 24 kV, current flow through the choke $L_1$ ceases, and the isolating diode $D_1$ (being reverse biased) turns off. The capacitor $C_2$ retains the 24 kV charge until the thyratron $S_1$ is switched on.

The next phase of operation of the electrical excitation circuit 10 shown in FIG. 2 is a medium speed charge of the pulse forming network 18. With the capacitor $C_2$ charged to 24 kV, the thyratron $S_1$ is then switched on by a trigger signal from the pulse generator circuit 20. The 24 kV charge on the capacitor $C_2$ causes a sinusoidal current of 3200 amperes peak to flow out of the capacitor $C_2$. A fraction of the current flows in the direction from bottom to top in FIG. 2 through the saturable inductor switch $S_2$ forcing it out of saturation and into a high inductance (unsaturated) state. The bulk of the current flows into the capacitor $C_3$ and the series combination of the magnetic diode charging inductor $L_3$ and the capacitor $C_4$. This charges the capacitors $C_3$ and $C_4$ to a voltage of approximately 24 kV with negative polarity on the second node $TP_2$ in one microsecond.

The portion of this current flowing through the magnetic diode charging inductor $L_3$ produces a prepulse voltage across the electrodes 26 proportional to the inductance of the magnetic diode charging inductor. This prepulse must be held low enough to prevent breakdown of the laser gas. The magnetic diode charging inductor $L_3$ is magnetically biased into a low inductance (saturated) state by current flowing from the $L_3$ bias power source through the choke $L_5$ and the bias winding of the magnetic diode charging inductor in the direction from bottom to top in FIG. 2. Furthermore, the current flow from common toward the third node $TP_3$ during the charging of the capacitor $C_4$ adds to the bias current which also holds the magnetic diode charging inductor $L_3$ in a low inductance state. This is adequate to avoid any prepulse causing a breakdown of the laser gas.

The voltage from common to the second node $TP_2$ increases (as a $1-\cos(\omega t)$ function), and at the peak of the voltage, the saturable inductor switch $S_2$ transposes to a saturated state, that is, saturates in the reverse direction, which allows current to flow through the saturable inductor switch in the direction from bottom to top in FIG. 2 in opposition to the bias current which is swamped out. The time required for the saturable inductor switch $S_2$ to reverse saturate coincides with the peak of the voltage and is determined by the voltage across the saturable inductor switch and the bias current through the bias winding of the saturable inductor switch. Adjustment of this bias current permits operation over a range of voltages with saturation always occurring at the peak.

The next phase of operation of the electrical excitation circuit 10 shown in FIG. 2 is the inversion of the voltage on half of the pulse forming network 18. When the saturable inductor switch $S_2$ reverse saturates and switches to a low inductance state, current flows out of the capacitor $C_3$. A fraction of the current flows back through the inductor $L_2$ and charges the capacitor $C_2$ to a low reverse voltage, which aids recovery of the thyratron $S_1$. Part of the current attempts to flow through the capacitor $C_4$ and the magnetic diode charging inductor $L_3$, which would discharge the capacitor $C_4$ and not produce laser output. However, this current is opposite to the bias current through the magnetic diode charging inductor $L_3$, which causes the magnetic diode charging inductor to assume a high inductance state. (Saturable inductor $L_3$ acts as a magnetic diode.) This minimizes the loss of charge on the capacitor $C_4$. The bulk of the current through the saturable inductor switch $S_2$ flows from one terminal of the capacitor $C_3$ to the other, thereby inverting the voltage across it in 0.1 microsecond.

When the polarity of the voltage across the capacitor $C_3$ is inverted, a voltage of nearly 48 kV is impressed across the electrodes 26. This is adequate to break down the laser gas so that current flows through the discharge loop comprising the capacitors $C_3$ and $C_4$ and the distributed inductance $L_D$.

The final phase of operation of the electrical excitation circuit 10 shown in FIG. 2 is the laser discharge. A fraction of the current from the series combination of the capacitors $C_3$ and $C_4$ flows through the magnetic diode charging inductor $L_3$ which is still in a high inductance state and is lost. As the voltage on the capacitor $C_3$ rings past the peak value, current reverses in the saturable inductor switch $S_2$ forcing it out of saturation and back into a high inductance state, which minimizes the current lost through the saturable inductor switch. The bulk of the current flows through the laser gas for 0.1 microsecond, thereby producing a laser pulse.

The voltage rise time is proportional to the inductance of the discharge circuit switch (saturable inductor switch $S_2$ saturated). The discharge time is proportional to the inductance of the discharge loop ($L_D$). Consequently, the electrial excitation circuit 10 has a fast voltage rise time and a comparable length discharge time in the load, as is desired in many lasers.

The pulse forming network 18 included in the electrical excitation circuit 10 includes a saturable inductor switch $S_2$ as opposed to a spark gap or thyratron switch. The low inductance saturable inductor switch $S_2$ inverts the voltage on the capacitor $C_3$, a function usually implemented using a spark gap or thyratron switch, both of which have a relatively high inductance.

Furthermore, the inversion of the voltage on the capacitor $C_3$ is the result of the sinusoidal current through the switch which reverses at the peak voltage, diverting much of the load current through the switch. Use of the saturable inductor switch $S_2$ rather than a spark gap avoids loss since the saturable inductor switch unsaturates when the current reverses, switching to a high inductance value. This results in a greater fraction of the stored energy being deposited into the laser load 14.

The saturable inductor switch $S_2$ has additional advantages over conventional spark gap switches. Advantages include longer lifetime, high pulse rate operation, and simplicity.

The pulse forming network 18 included in the electricl excitation circuit 10 includes a magnetic diode charging inductor $L_3$ as opposed to a linear inductor. As described above, the magnetic diode charging inductor $L_3$ is across the laser load 14 to allow charging of the capacitor $C_4$. The inductance of the magnetic diode charging inductor $L_3$ must be low enough during charging of the capacitor $C_4$ to prevent laser gas breakdown (prepulse).

The ideal inductor would have zero inductance during charging of the capacitor $C_4$ and infinite inductance during laser discharge. A low inductance during laser discharge diverts current from the discharge, reducing laser efficiency. A single value linear inductor is a compromise at best between too high and too low an inductance.

The magnetic diode charging inductor $L_3$ has the property of high inductance when the ferromagnetic material is unsaturated and low inductance when the material saturates. Typically, there is a ratio of 100:1 between high and low inductance. The current reversal in the magnetic diode charging inductor $L_3$ between charging of the capacitor $C_4$ and laser discharge drives the magnetic diode charging inductor from a saturated (low inductance) state to an unsaturated (high inductance) state, thereby approximating an ideal inductor.

Figure 4:
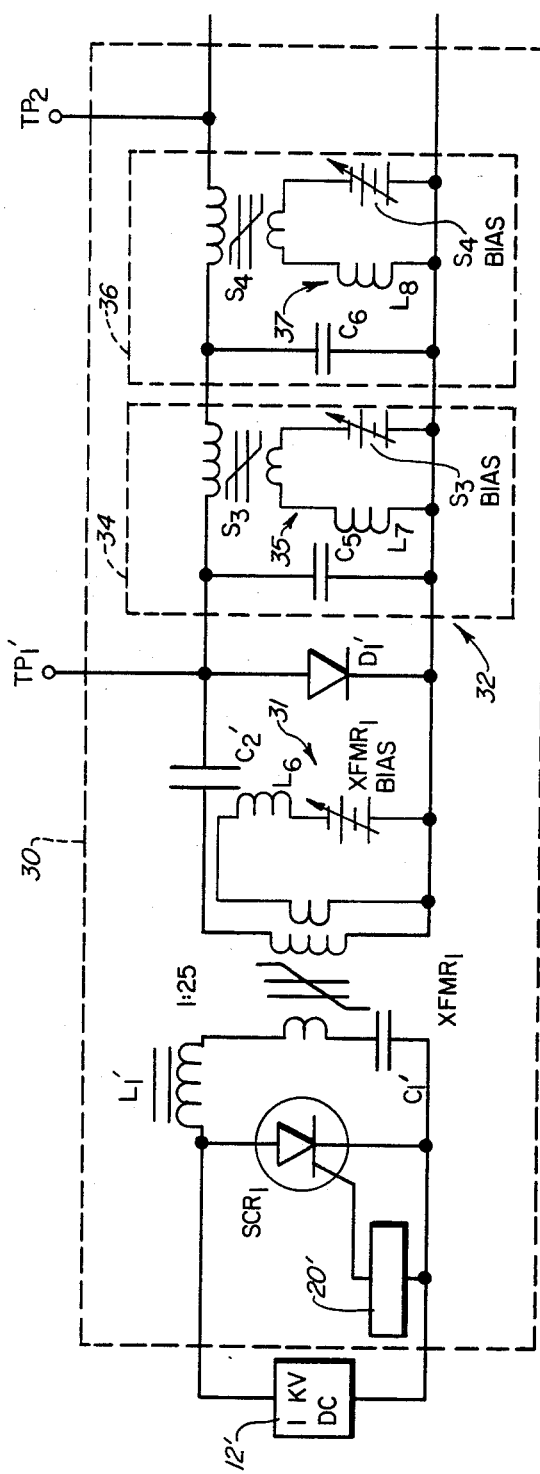
FIG. 4 is a partial schematic diagram of another embodiment of an electrical excitation circuit in accordance with the invention for connecting an electrical power source to a laser load.

In another embodiment of the electrical excitation circuit in accordance with the invention, a cascaded magnetic charging circuit 30 shown in FIG. 4 replaces the charging circuit 16 described above in conjunction with FIG. 2. Referring to FIG. 4, the cascaded magnetic charging circuit 30 is connected to a power source 12'. The power source 12' is a relatively low voltage power supply compared with the power source 12 described in conjunction with FIG. 2. The power source 12', for example, can be a 1 kV direct current rectified power supply.

The cascaded magnetic charging circuit 30 shown in FIG. 4 also includes a charging transformer or choke $L_1'$, the primary winding of a saturable step-up transformer $XFMR_1$, and a power source capacitor $C_1'$ connected in series between the power source 12' and common. The saturable step-up transformer $XFMR_1$, for example, can be a 1:25 transformer. The cascaded magnetic charging circuit 30 additionally includes a biasing circuit 31 for the saturable step-up transformer $XFMR_1$, which comprises an $XFMR_1$ bias power source and a choke $L_6$ connected in series with the bias winding of the saturable step-up transformer. The $XFMR_1$ bias power source is an adjustable direct current power supply connected so that bias current flows through the bias winding of the saturable step-up transformer $XFMR_1$ in the direction from bottom to top in FIG. 4. The choke $L_6$ provides isolation of the $XFMR_1$ bias power source from high voltage pulses produced by transformer action on the bias winding of the saturable step-up transformer $XFMR_1$. A silicon controlled rectifier $SCR_1$ included in the cascaded magnetic charging circuit 30 is shunted across the choke $L_1'$, the primary winding of the saturable step-up transformer $XFMR_1$, and the capacitor $C_1'$, the gate of the silicon controlled rectifier being connected to a source of an input trigger signal generated by a pulse generator circuit 20'.

The cascaded magnetic charging circuit 30 further includes a capacitor $C_2'$ connected between the secondary winding of the saturable step-up transformer $XFMR_1$ and a first terminal or node $TP_1'$. An isolating or charging diode $D_1'$ included in the cascaded magnetic charging circuit 30 is connected between the first node $TP_1'$ and common.

The cascaded magnetic charging circuit 30 finally includes at least one saturable inductor switch circuit 32, such as a saturable inductor switch circuit 34, comprising a capacitor $C_5$ connected between the first node $TP_1'$ and common, as well as a saturable inductor switch $S_3$ connected between the first node $TP_1'$ and the second node $TP_2$ which corresponds to the second node $TP_2$ shown in FIG. 2. The saturable inductor switch circuit 34 also preferably comprises a biasing circuit 35 for the saturable inductor switch $S_3$, which comprises a $S_3$ bias power source and a choke $L_7$ connected in series with the bias winding of the saturable inductor switch.

The $S_3$ bias power source is an adjustable direct current power supply connected so that bias current flows through the bias winding of the saturable inductor switch $S_3$ in the direction from left to right in FIG. 4. The choke $L_7$ provides isolation of the $S_3$ bias power source from high voltage pulses produced by transformer action on the bias winding of the saturable inductor switch $S_3$.

Referring to FIG. 4, a second saturable inductor switch circuit 36 is shown comprising a capacitor $C_6$ connected between the saturable inductor switch $S_3$ and common, as well as a saturable inductor switch $S_4$ connected between the saturable inductor switch $S_3$ and the second node $TP_2$. The saturable inductor switch circuit 36 also preferably comprises a biasing circuit 37 for the saturable inductor switch $S_4$, which comprises a $S_4$ bias power source and a choke $L_8$ connected in series with the bias winding of the saturable inductor switch. The $S_4$ bias power source is an adjustable direct current power supply connected so that bias current flows through the bias winding of the saturable inductor switch $S_4$ in the direction from left to right in FIG. 4. The choke $L_8$ provides isolation of the $S_4$ bias power source from high voltage pulses produced by transformer action on the bias winding of the saturable inductor switch $S_4$.

The various saturable inductor switch circuits 32 are cascaded to gradually narrow and sharpen the pulse fed to the pulse forming network 18 shown in FIG. 2. Each saturable inductor switch, $S_3$, $S_4$, etc., shown in FIG. 4 is used as a "hold off" device. After a "hold off" period elapses, that is, the saturable inductor switch saturates, the discharge current from the associated capacitor, $C_5$, $C_6$, etc., respectively, flows as though the saturable inductor were no longer there, and the capacitor in the following saturable inductor switch circuit 32 is charged. The output of the last saturable inductor switch circuit 32 is connected between the second node $TP_2$ and common.

The power source 12' and cascaded magnetic charging circuit 30 shown in FIG. 4 can be substituted for the power source 12 and the charging circuit 16 shown in FIG. 2. Considered in more detail, the electrical excitation circuit 10 shown in FIG. 2 is broken along line 4—4. The power source 12 and the charging circuit 16 are disconnected. The output of the last saturable inductor switch circuit 32 shown in FIG. 4 is then connected in shunt across the saturable inductor switch $S_2$ shown in FIG. 2 in order to accomplish the substitution.

The inclusion of the cascaded magnetic charging circuit 30 provides an electrical excitation circuit 10 in which no spark gaps or thyratron switches are included. That is, the electrical excitation circuit 10 includes only a silicon controlled rectifier $SCR_1$ and saturable inductors as switches and therefore has an extended lifetime. Furthermore, the saturable step-up transformer $XFMR_1$ provides isolation of the relatively low voltage power source 12' from the high voltages elsewhere in the electrical excitation circuit 10.

In the first phase of operation of the electrical excitation circuit 10 which includes the cascaded magnetic charging circuit 30 shown in FIG. 4, the power source capacitor $C_1'$ is charged from the 1 kV power source 12' through the choke $L_1'$ and the primary winding of the saturable step-up transformer $XFMR_1$ by current flowing through the primary winding in the direction from top to bottom in FIG. 4. The primary and secondary windings of the saturable step-up transformer $XFMR_1$ are configured so that the direction of current flowing in the secondary winding is opposite to that in the primary winding. The charging diode $D_1'$ blocks any significant charging of the charging capacitor $C_2'$ during the charging of the power source capacitor $C_1'$.

After the power source capacitor $C_1'$ is fully charged, the pulse generator circuit 20' produces a trigger signal which fires the silicon controlled rectifier $SCR_1$. Current flows out of the power source capacitor $C_1'$ through the primary winding of the saturable step-up transformer $XFMR_1$ in the direction from bottom to top in FIG. 4. The current flowing through the primary winding of the saturable step-up transformer $XFMR_1$ induces a voltage across the secondary winding of the saturable step-up transformer which causes a current to flow through the secondary winding in the direction from bottom to top in FIG. 4, as well as through the charging capacitor $C_2'$ and charging diode $D_1'$. The discharge of the power source capacitor $C_1'$ takes 60 microseconds adjusted by the level of the bias current flowing through th bias winding of the saturable step-up transformer $XFMR_1$, at the end of which time the charging capacitor $C_2'$ is charged to a peak voltage of 25 kV.

When the voltage on the charging capacitor $C_2'$ reaches the peak voltage, the saturable step-up transformer $XFMR_1$ saturates. Consequently, the charging capacitor $C_2'$ discharges through the secondary winding of the saturable step-up transformer $XFMR_1$ and charges the capacitor $C_5$ included in the initial saturable inductor switch circuit 34 with negative polarity on the first node $TP_1'$. As adjusted by the level of the bias current flowing through the bias winding of the saturable inductor $S_3$, at the peak of the voltage on the capacitor $C_5$, the saturable inductor switch $S_3$ included in the saturable inductor switch circuit 34 saturates, thereby transferring the voltage on the capacitor $C_5$ to the capacitor $C_6$ included in the next saturable inductor switch circuit 36. Similarly, as adjusted by the level of the bias current flowing through the bias winding of the saturable inductor $S_4$, at the peak of the voltage on the capacitor $C_6$, the saturable inductor switch $S_4$ included in the saturable inductor switch circuit 36 saturates, thereby transferring the voltage on the capacitor $C_6$ to the pulse forming network 18 shown in FIG. 2.

Each cascaded saturable inductor switch circuit 32 shown in FIG. 4 provides pulse rise time sharpening and pulse width compression. The pulse width of the voltage transferred from the capacitor $C_6$ to the pulse forming network 18 shown in FIG. 2, for example, is 800 nanoseconds as compared to the 60-microseconds pulse width of the voltage transferred to the charging capacitor $C_2'$ shown in FIG. 4. The pulse forming network 18 shown in FIG. 2 operates in the manner described earlier for imparting electrical energy to the laser load 14.

By way of example, the electrical excitation circuit 10 shown in FIG. 2 was adapted for exciting a xenon chloride excimer laser load. Referring to FIG. 2, the values and types for the various circuit elements were selected as shown in Table I.

TABLE I

| | |
|---|---|
| $C_1$ | 4.7 microfarads |
| $L_1$ | 3.0 henries |
| $D_1$ | S1KW48KA4 |
| $S_1$ | HY-5 |
| $C_2$ | 60 nanofarads |
| $L_2$ | 21 microhenries |

TABLE I-continued

| | |
|---|---|
| $S_2$ | 1.9 microhenries (unsaturated) |
| $C_3, C_4$ | 32 nanofarads |
| $L_3$ | 60 microhenries (unsaturated) |
| $L_4, L_5$ | 100 microhenries |

As an alternative, the cascaded magnetic charging circuit 30 shown in FIG. 4 was substituted for the charging circuit 16 shown in FIG. 2, in which case the values and types for the various circuit elements were selected as shown in Table II.

TABLE II

| | |
|---|---|
| $SCR_1$ | T7SH164624DN |
| $L_1'$ | 10 microhenries |
| $XFMR_1$ | 1:25 step-up, 410 microhenries (saturated) |
| $C_1'$ | 40 microfarads |
| $C_2', C_5, C_6$ | 60 nanofarads |
| $D_1'$ | S1KW48KA4 |
| $S_3$ | 30 microhenries (saturated) |
| $S_4$ | 1.5 microhenries (saturated) |
| $S_2$ | 1.9 microhenries (unsaturated) |
| $C_3, C_4$ | 32 nanofarads |
| $L_3$ | 60 microhenries (unsaturated) |
| $L_4, L_5$ | 100 microhenries |
| $L_6, L_7, L_8$ | 150 microhenries |

The capacitors are preferably discrete ceramic capacitors. However, water line capacitors can be used, although high voltage arcs and corrosion can occur in water line capacitors.

Figure 5:
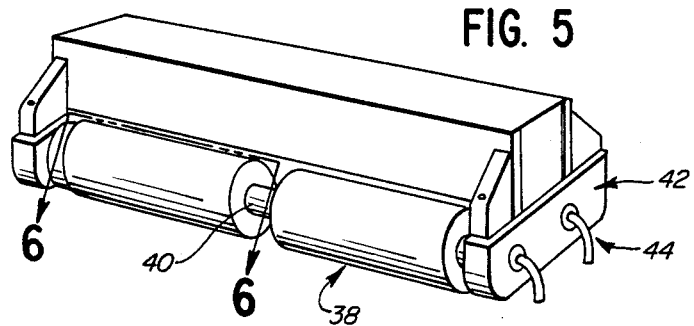
FIG. 5 is a perspective view which shows a preferred configuration for a saturable magnetic element.

The saturable inductor switch $S_2$ and the magnetic diode charging inductor $L_3$ shown in FIG. 2 can be structured as illustrated in FIG. 5 and include an inductance element 38 which surrounds a nonconductive tube 40 supported by a housing 42. The nonconductive tube 40 is constructed from insulative material, such a polyvinylchloride. The housing 42 can contain the remainder of the circuit elements of the pulse forming network 18 shown in FIG. 2 and is constructed from insulative material, such as polyvinylchloride. Bias current flows through a conductor 44 which is disposed in the interior of the nonconductive tube 40 as shown in FIG. 5.

Figure 6:
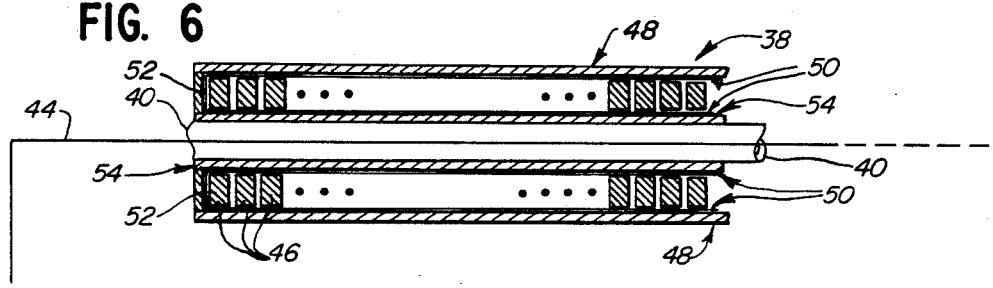
FIG. 6 is a cross-sectional view along line 6—6 of FIG. 5.

FIG. 6 is a cross-sectional view along the line 6—6 shown in FIG. 5 and illustrates the structure of the inductance element 38 in greater detail. The inductance element 38 includes a plurality of cores 46 contained within an outer length of copper tubing 48. There can be, for example, 24 cores, such as 3C8 Ferroxcube cores included in the inductance element 38. A sheet of insulative material 50, such as polypropylene sheet, is wrapped around the cores 46. Kapton tape insulation is preferably applied to the end core 46, as indicated generally by the numeral 52. An inner length of copper tubing 54 lies between the cores 46, which are wrapped with the insulative material 50, and the nonconductive tube 40. The outer copper tubing 48 is connected to the inner copper tubing 54 at one end (i.e., the left end in FIG. 6). The outer copper tubing 48 is connected at the other end (i.e., the right end in FIG. 6) to one of the nodes $TP_2$ or $TP_3$ of the pulse forming network 18 shown in FIG. 2. The inner copper tubing 54 is connected at the other end (i.e., the right end in FIG. 6) to common.

The bias winding in FIG. 6 is illustrated as a single turn bias supply conductor 44. The saturable inductor switches $S_3$ and $S_4$ shown in FIG. 4 can also be structured as shown in FIGS. 5 and 6.

Figure 7:
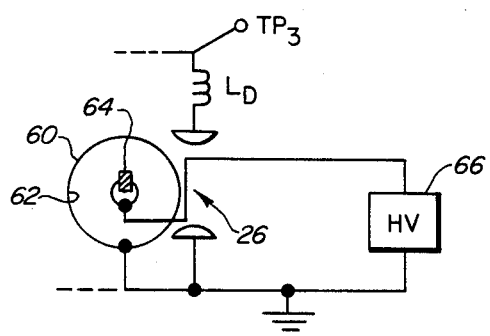
FIG. 7 is a schematic diagram of an x-ray pre-ionization circuit preferably included in the circuit of FIG. 2.

The electrical excitation circuit 10 as indicated earlier preferably includes a pre-ionization means 28 for conditioning the laser gas as shown in FIG. 2. The pre-ionization means is preferably an X-ray circuit as illustrated in FIG. 7. The X-ray circuit comprises a length of anodized aluminum tubing 60 plated on the interior with a layer of gold, indicated by the numeral 62, as the anode, and carbon felt 64 as the cathode. A high voltage pulsed power source 66 is connected across the anode and cathode for producing X-rays which ionize the laser gas between the electrodes 26. The aluminum tubing 60 is evacuated to a pressure of $5 \times 10^{-6}$ mm Hg during operation.

Figure 8:
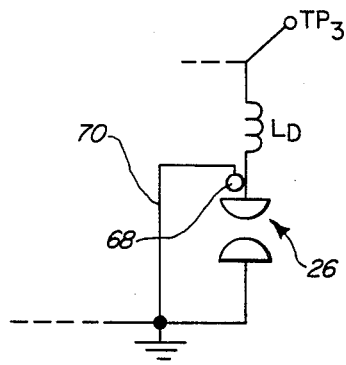
FIG. 8 is a schematic diagram of a corona pre-ionization circuit alternatively included in the circuit of FIG. 2.

Alternatively, the pre-ionization means 28 shown in FIG. 2 can be a corona pre-ionization circuit as illustrated in FIG. 8. The corona pre-ionization circuit comprises a corona element 68, which is formed by an insulated conductor contained within a quartz tube, disposed near the uppermost of the electrodes 26, as well as an insulated conductor 70, which connects the conductor within the corona element 68 to common. The corona pre-ionization circuit does not require an additional power source.

A laser incorporating an electrical excitation circuit as provided by the present invention has many advantages over conventional pulse shaping networks which include switches such as multichannel arc switches (rail gaps), thyratrons, spark gaps, or ignitrons. The electrical excitation circuit according to the present invention can be operated at high repetition rates and at high powers and voltages and will have a very long lifetime compared with conventional laser discharge circuits.

Although the invention has been described and illustrated in detail, it is to be clearly understood that the same is by way of illustration and example only and is not to be taken by way of limitation. Consequently, the spirit and scope of this invention are ascertainable only by reference to the appended claims.

What is claimed is:

1. An electrical excitation circuit for a gas laser connectable between a power source and a laser load comprising:
   charging circuit means connected to the power source; and
   a pulse forming network connected to the charging circuit means and the laser load, the pulse forming network comprising:
   (a) a saturable inductor switch alternatively having an unsaturated state and a saturated state, the saturable inductor switch being shunted across the charging circuit means; and
   (b) at least one capacitor shunted across the saturable inductor switch and connected to the laser load, the at least one capacitor being charged by the charging circuit means when the saturable inductor switch is in the unsaturated state and being discharged through the laser load when the saturable inductor switch transposes to the saturated state.

2. The electrical excitation circuit of claim 1 wherein the at least one capacitor is a discrete ceramic capacitor.

3. The electrical excitation circuit of claim 1 wherein the operating point of the saturable inductor switch is controlled by a bias circuit, thereby allowing adjustment of the operating point for a given laser load.

4. The electrical excitation circuit of claim 1 further comprising:

(c) a second capacitor connected between the at least one capacitor and the laser load; and
   (d) a magnetic diode charging inductor shunted across the laser load;
   the second capacitor being charged by the charging circuit means through the magnetic diode charging inductor when the saturable inductor switch is in the unsaturated state and being discharged through the laser load in series with the at least one capacitor when the saturable inductor switch transposes to the saturated state;
   thereby increasing the discharge voltage across the laser load.

5. The electrical excitation circuit of claim 4 wherein the second capacitor is a discrete ceramic capacitor.

6. The electrical excitation circuit of claim 4 wherein the operating point of the magnetic diode charging inductor is controlled by a bias circuit, thereby allowing adjustment of the operating point for a given laser load.

7. The electrical excitation circuit of claim 1 wherein the charging circuit means comprises a power source capacitor shunted across the power source and connected by a series-connected choke and charging diode to a parallel circuit comprising, as one branch, a triggerable thyratron and, as the other branch, a charging capacitor and an inductor, the charging capacitor and inductor being in series with the saturable inductor switch, the at least one capacitor being charged when the thyratron is triggered.

8. The electrical excitation circuit of claim 4 wherein the charging circuit means comprises a power source capacitor shunted across the power source and connected by a series-connected choke and charging diode to a parallel circuit comprising, as one branch, a triggerable thyratron and, as the other branch, a charging capacitor and an inductor, the charging capacitor and inductor being in series with the saturable inductor switch, the at least one capacitor being charged when the thyratron is triggered.

9. The electrical excitation circuit of claim 1 wherein the charging circuit means comprises a series-connected choke, primary winding of a saturable step-up transformer, and power source capacitor in a parallel circuit with a triggerable silicon controlled rectifier connected across the power source and further comprises a charging capacitor and a charging diode connected in series across the secondary winding of the step-up transformer and at least one saturable inductor switch circuit, comprising a capacitor and a saturable inductor switch, connected between the charging capacitor and the pulse forming network, the at least one saturable inductor switch circuit being shunted across the saturable inductor switch included in the pulse forming network.

10. The electrical excitation circuit of claim 9 wherein a plurality of saturable inductor switch circuits is cascaded between the charging capacitor and the pulse forming network, each additional saturable inductor switch circuit providing a further degree of pulse compression and shaping.

11. The electrical excitation circuit of claim 4 wherein the charging circuit means comprises a series-connected choke, primary winding of a saturable step-up transformer, and power source capacitor in a parallel circuit with a triggerable silicon controlled rectifier connected across the power source and further comprises a charging capacitor and a charging diode connected in series across the secondary winding of the step-up transformer and at least one saturable inductor switch circuit, comprising a capacitor and a saturable inductor switch, connected between the charging capacitor and the pulse forming network, the at least one saturable inductor switch circuit being shunted across the saturable inductor switch included in the pulse forming network.

12. The electrical excitation circuit of claim 11 wherein a plurality of saturable inductor switch circuits is cascaded between the charging capacitor and the pulse forming network, each additional saturable inductor switch circuit providing a further degree of pulse compression and shaping.

13. The electrical excitation circuit of claim 1 further comprising a pre-ionization means for conditioning the laser gas so that a uniform discharge occurs across the electrodes of the laser.

14. The electrical excitation circuit of claim 13 wherein the pre-ionization means is an X-ray circuit.

15. The electrical excitation means is a corona pre-ionization circuit.

16. The electrical excitation circuit of claim 9 wherein the operating point of the saturable inductor switch of the at least one saturable inductor switch circuit is controlled by a bias circuit, thereby allowing adjustment of the operating point for a given laser load.

17. The electrical excitation circuit of claim 11 wherein the operating point of the saturable inductor switch of the at least one saturable inductor switch circuit is controlled by a bias circuit, thereby allowing adjustment of the operating point for a given laser load.

18. An electrical excitation circuit for a gas laser connectable between a power source and a laser load comprising:
  a power source capacitor shunted across the power source;
  a series-connected choke and charging diode connected between the power source and a first node;
  a triggerable thyratron connected between the first node and common;
  the series-connected choke and charging diode and thyratron being series-connected and shunted across the power source capacitor;
  a series-connected charging capacitor and inductor connected between the first node and a second node;
  a saturable inductor switch connected between the second node and common;
  a first pulse forming network capacitor connected between the second node and common;
  a second pulse forming network capacitor connected between the second node and a third node; and
  a magnetic diode charging inductor connected between the third node and common;
  the second pulse forming network capacitor and the magnetic diode charging inductor being series-connected and shunted across the first pulse forming network capacitor;
  the magnetic diode charging inductor being shunted across the laser load.

19. The electrical excitation circuit of claim 18 wherein the operating points of the saturable inductor switch and the magnetic diode charging inductor are controlled by bias circuits, thereby allowing adjustment of the operating points for a given laser load.

20. The electrical excitation circuit of claim 18 further comprising a pre-ionization means for conditioning the laser gas so that a uniform discharge occurs across the electrodes of the laser.

21. An electrical excitation circuit for a gas laser connectable between a power source and a laser load comprising:
  a silicon controlled rectifier shunted across the power source;
  a series-connected choke, primary winding of a saturable step-up transformer, and power source capacitor connected between the power source and common;
  the series-connected choke, primary winding of the saturable step-up transformer, and power source capacitor being shunted across the silicon controlled rectifier;
  a charging capacitor connected between a secondary winding of the saturable step-up transformer and a first node;
  a charging diode connected between the first node and common;
  the charging capacitor and charging diode being series-connected and shunted across the secondary winding of the saturable step-up transformer;
  at least one saturable inductor switch circuit connected between the first node and a second node;
  a saturable inductor switch connected between the second node and common;
  a first pulse forming network capacitor connected between the second node and common;
  a second pulse forming network capacitor connected between the second node and a third node; and
  a magnetic diode charging inductor connected between the third node and common;
  the second pulse forming network capacitor and the magnetic diode charging inductor being series-connected and shunted across the first pulse forming network capacitor;
  the magnetic diode charging inductor being shunted across the laser load.

22. The electrical excitation circuit of claim 21 wherein a plurality of saturable inductor switch circuits is cascaded between the first node and the second node, each additional saturable inductor switch circuit providing a further degree of pulse compression and shaping.

23. The electrical excitation circuit of claim 21 wherein the operation points of the at least one saturable inductor switch circuit, saturable inductor switch, and magnetic diode charging inductor are controlled by bias circuits, thereby allowing adjustment of the operating points for a given laser load.

24. The electrical excitation circuit of claim 21 further comprising a pre-ionization means for conditioning the laser gas so that a uniform discharge occurs across the electrodes of the laser.

25. A method for electrically exciting a gas laser connected to a power source comprising the steps of:
  charging at least one capacitor connected to the laser load and shunted across a saturable inductor switch alternatively having an unsaturated state and a saturated state, the at least one capacitor being charged when the saturable inductor switch is in the unsaturated state; and
  discharging the capacitor through the laser load when the saturable inductor switch transposes to the saturated state.

26. The method of claim 25 further comprising the step of controlling the operating point of the saturable inductor switch by a bias circuit, thereby allowing adjustment of the operating point for a given laser load.

27. The method of claim 25 further comprising the steps of:

charging a second capacitor connected between the at least one capacitor and the laser load, the second capacitor being charged through a magnetic diode charging inductor shunted across the laser load when the saturable inductor switch is in the unsaturated state; and discharging the second capacitor through the laser load in series with the at least one capacitor when the saturable inductor switch transposes to the saturated state;

thereby increasing the discharge voltage across the laser load.

28. The method of claim 27 further comprising the step of controlling the operating point of the magnetic diode charging inductor by a bias circuit, thereby allowing adjustment of the operating point for a given laser load.

29. The method of claim 25 further comprising the step of pre-ionizing the laser gas so that a uniform discharge occurs across the electrodes of the laser.

* * * * *

UNITED STATES PATENT OFFICE
CERTIFICATE OF CORRECTION

Patent No. 4,549,091            Dated October 22, 1985

Inventor(s) Theodore S. Fahlen and Barton Mass

It is certified that error appears in the above-identified patent and that said Letters Patent are hereby corrected as shown below:

Column 1, line 24, "selecte" should read --selected--.

Column 2, lines 38 & 39, "tradeoff" should read --trade-off--.

Column 10, lines 55 & 56, "electricl" should read --electrical--.

Column 17, line 20, after the word "excitation" insert the words --circuit of claim 13 wherein the pre-ionization--.

Signed and Sealed this
Ninth Day of December, 1986

*Attest:*

DONALD J. QUIGG

*Attesting Officer*      *Commissioner of Patents and Trademarks*